United States Patent
Leussler et al.

(10) Patent No.: US 12,241,952 B2
(45) Date of Patent: Mar. 4, 2025

(54) COIL ARRANGEMENT FOR MAGNETIC RESONANCE IMAGING SYSTEM

(71) Applicant: KONINKLIJKE PHILIPS N.V., Eindhoven (NL)

(72) Inventors: Christoph Leussler, Hamburg (DE); Michael Gunter Helle, Hamburg (DE); Daniel Wirtz, Hamburg (DE); Gereon Vogtmeier, Aachen (DE); Steffen Weiss, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 883 days.

(21) Appl. No.: 17/273,741

(22) PCT Filed: Sep. 3, 2019

(86) PCT No.: PCT/EP2019/073377
§ 371 (c)(1),
(2) Date: Mar. 5, 2021

(87) PCT Pub. No.: WO2020/048935
PCT Pub. Date: Mar. 12, 2020

(65) Prior Publication Data
US 2021/0278490 A1 Sep. 9, 2021

(30) Foreign Application Priority Data
Sep. 6, 2018 (EP) .................................... 18192939

(51) Int. Cl.
*G01R 33/34* (2006.01)
*G01R 33/3415* (2006.01)
*G01R 33/565* (2006.01)

(52) U.S. Cl.
CPC . *G01R 33/34084* (2013.01); *G01R 33/34046* (2013.01); *G01R 33/3415* (2013.01); *G01R 33/56509* (2013.01)

(58) Field of Classification Search
CPC ........ G01R 33/34084; G01R 33/34046; G01R 33/3415; G01R 33/56509; G01R 33/34
See application file for complete search history.

(56) References Cited

U.S. PATENT DOCUMENTS 5,379,768 A   1/1995   Smalen
5,400,787 A   3/1995   Marandos
(Continued)

OTHER PUBLICATIONS

International Search Report and Written Opinion from PCT/EP2019/073377 Mailed Dec. 20, 2019.

*Primary Examiner* — Ashley K Buran
*Assistant Examiner* — Dean N Edun

(57) ABSTRACT

The invention may improve image quality of magnetic resonance imaging (MRI). The invention is directed to a coil arrangement (200) for magnetic resonance imaging. It comprises a base structure having a variable shape, an RF coil arranged on or in the base structure, an actuator means at least partially extending along the base structure such that the base structure is deformable along and/or about at least one axis, a position detecting means adapted to detect a current position of at least a portion of the subject to be examined relative to the RF coil, and control means coupled to the position detecting means and the actuator means, wherein the control means is adapted to adjust the shape of the base structure to maintain a contact of an outer surface of the base structure (210) and/or the RF coil (220) with the at least portion of the subject by driving the actuator means in response to a detected change of the current position relative to a previous position. The invention is further directed to a (MRI) system, a method for positioning an RF (Continued)

coil for a magnetic resonance imaging system relative to a subject to be examined, and a non-transitory computer-readable medium.

19 Claims, 4 Drawing Sheets

(56) References Cited

U.S. PATENT DOCUMENTS

| | | | |
|---|---|---|---|
| 10,827,948 B1* | 11/2020 | Tramm | A61B 5/7405 |
| 10,874,871 B2* | 12/2020 | Ginhoux | A61N 2/006 |
| 2005/0122108 A1 | 6/2005 | Yasuhara et al. | |
| 2008/0129293 A1 | 6/2008 | Schnell et al. | |
| 2008/0204021 A1* | 8/2008 | Leussler | G01R 33/3415 |
| | | | 324/318 |
| 2008/0211495 A1 | 9/2008 | Steckner | |
| 2009/0012389 A1 | 1/2009 | Kundner et al. | |
| 2011/0074420 A1 | 3/2011 | Ladebeck | |
| 2013/0131498 A1* | 5/2013 | Taracila | G01R 33/34084 |
| | | | 324/322 |
| 2013/0211237 A1* | 8/2013 | Driemel | G01R 33/341 |
| | | | 324/322 |
| 2014/0021949 A1* | 1/2014 | Heismann | G01R 33/34007 |
| | | | 324/322 |
| 2014/0055133 A1* | 2/2014 | I | A61B 5/1128 |
| | | | 324/309 |
| 2015/0293188 A1 | 10/2015 | Haider et al. | |
| 2017/0095365 A1* | 4/2017 | Reese | G01R 33/3415 |
| 2017/0299669 A1 | 10/2017 | Hesels et al. | |
| 2018/0143271 A1 | 5/2018 | Xu | |

* cited by examiner

COIL ARRANGEMENT FOR MAGNETIC RESONANCE IMAGING SYSTEM

CROSS REFERENCE TO RELATED APPLICATIONS

This application is a U.S. national phase application of International Application No. PCT/EP2019/073377 filed on Sep. 3, 2019, which claims the benefit of EP Application Serial No. 18192939.9 filed on Sep. 6, 2018 and is incorporated herein by reference.

FIELD OF THE INVENTION

The present invention relates generally to magnetic resonance imaging, in particular to a magnetic resonance imaging coil arrangement, a magnetic resonance imaging, system, a method for positioning an RF coil for a magnetic resonance imaging system, and a non-transitory computer-readable medium.

BACKGROUND OF THE INVENTION

In magnetic resonance imaging (MRI), radio-frequency (RF) coils, may be used as receivers, transmitters or combined transceivers.

Usually, RF coils may be used as antennas for exciting nuclear spins and detecting signals from them. Widely used for MRI are in particular surface coils, which may be placed on or around a surface of a subject to be examined, and volume coils, which may be placed so as to surround a whole body or a specific region of the subject, such as a head or other extremities. By way of example, such RF coils may be provided as a birdcage coil, a transverse electromagnetic (TEM) resonator coil etc.

For the MRI quality, it may be considered that, for example, the distance of the RF coil from the subject to be examined may be an influencing factor for the RF coil sensitivity. Hence, this may be also a factor for the signal-to-noise ratio (SNR) of the RF coil which may influence MRI quality.

During the image acquisition, however, in particular the distance of the coil to the subject may be influenced by several factors, for example, by a movement of the subject, by inhalation or exhalation of the subject etc.

US 2015/0293188 A1 describes a method for positioning at least one local coil for recording magnetic resonance data with a magnetic resonance device, wherein at least one surface data record, which describes the surface of the patient to be recorded who is already positioned for recording on a patient couch of the magnetic resonance device, is measured, the surface characteristic of the patient is extracted from the surface data record and at least one position and/or shape of at least one of the at least one local coil is chosen as a function of the surface characteristic in such a way that there is provided a pre-determined distance between the surface of the patient and the surface of the local coil.

SUMMARY OF THE INVENTION

There may therefore be a need to improve magnetic resonance imaging, in particular with regard to improving a signal-to-noise ratio (SNR) of a radio-frequency (RF) coil. The object of the present invention is solved by the subject-matter of the independent claims, wherein further embodiments are incorporated in the dependent claims.

According to an aspect, there is provided a magnetic resonance imaging (MRI) coil arrangement, which comprises a base structure having a variable shape and at least one RF coil arranged on or at least partly in the base structure. The MRI coil arrangement further comprises an actuator means extending along the base structure such that the base structure is deformable along and/or about at least one axis to, for example, form a receiving space for a subject to be examined, and a position detecting means adapted or configured to detect a current position of at least a portion of the subject, in particular relative to the RF coil and/or an MRI system. The MRI coil arrangement further comprises a control means coupled to the position detecting means and the actuator means, wherein the control means is adapted or configured to adjust the shape of the base structure to maintain a contact of an outer surface of the base structure and/or the RF coil with the at least portion of the subject by driving the actuator means in response to a detected change of the current position relative to a previous position of the at least portion of the subject. In other words, particularly during imaging, one or both of the base structure and the RF coil may be in, preferably direct, contact with the subject or its surface. In order to maintain this contact even when the subject is moving, the shape of the base structure is adjusted accordingly.

The MRI coil arrangement may be provided as a local RF coil arrangement of any type, such as a surface RF coil, a volume RF coil etc., and in particular as a birdcage RF coil, a transverse electromagnetic (TEM) RF coil or the like.

The variable shape of the base structure may be provided, for example, by using a flexible material which allows for deforming, e.g. bending, enlarging in size, reducing in size or the like. This may allow changing the geometrical form, in particular the outer form, of the base structure between a flat shape and different curvatures and vice versa. The actual RF coil arranged in or on the base structure may be rigid or flexible, and may be provided as an array. The actuator means may be provided so as to be mechanically or fluidically operable. It may further be magnetic resonance (MR) compatible and, for example, be controllable by optical signals or the like. By way of example, the actuator means may be provided as a pressure source, such as a compressor or the like, and may be formed integrally with or separately to the MRI coil arrangement. The position detecting means may be a suitable sensor adapted or configured to detect an absolute position, a relative position and/or a movement of the subject or a body portion of the same. The control means may be any electronic device, comprising a processor, a storage and/or memory unit, a communication interface etc.

Driving the actuator means may vary the shape of the base structure, whereby, for example, the base structure and/or the RF coil may be displaced relative to the previous position and/or the subject or patient. This may allow at least a partial compensation for the detected change of the current position relative to a previous position to be provided. Further, the base structure may adapt optimally to the shape of the subject, like a body or a part of the body. Hence, the MRI coil arrangement may be positioned in a close and/or defined distance to and/or in contact with the body, and thus a better SNR as well as a better image quality may be achieved. Also, positioning the MRI coil arrangement at an exact position may be facilitated. Hence, time consuming fixation and fitting, which is usually provided by clinicians, may be omitted and the overall workflow may be optimized. Also, stress to the patient during positioning the MRI coil arrangement may be decreased.

In an embodiment, the actuator means may be arranged on a side of the coil facing away from the subject.

Thus, the actuator means may push the coil towards the subject. This may further improve positioning of the RF coil in a defined, minimum distance relative to the subject, e.g. a surface of patient.

According to an embodiment, the actuator means may comprise one or more conduits coupled to and adapted to be controlled by the control means.

The one or more conduits may be configured, for example, for conveying a fluid medium, e.g. a liquid or gaseous medium, or to drive a mechanical element, which, in turn, may be driven by the actuator means. By way of example, the conduits may be fluidly tight and configured to be driven by the actuator means by air, in particular pneumatically.

In an embodiment, at least two conduits may open into spaced-apart sections of the base structure and may be selectively controllable.

Hence, the base structure may be formed into different shapes and curvatures.

According to an embodiment, in the conduit, a strand-shaped element may be guided, which strand-shaped element may be in engagement with the base structure.

The strand-shaped element may be provided as a cable, e.g. a Bowden cable or the like. Preferably, the strand-shaped element may be non-magnetic, e.g. made from plastics, so as to be MR compatible. An end of the strand-shaped element facing away from the actuator means may be engaged to the base structure. For this, the deformable base structure may have a fastening structure, e.g. a hinge band or the like, which allows engagement with the respective portion of the deformable base structure to rest in a desired position close to subject body or the whole structure rests/forms close to the subject.

In an embodiment, the at least one conduit may be connected at one end to a pressure source and fluidically opens at another end to at least one cushion having a variable shape.

Accordingly, the actuator means may be provided as or may comprise the pressure source. The one or more cushions may also be referred to as an internal cushion or internal cushions and may be a, in particular integral, part of the MRI coil arrangement. The pressure source, which may also be referred to as the actuator means, may be configured to provide a positive or negative pressure relative to the ambient pressure.

According to an embodiment, the at least one cushion may be adapted or configured to provide a feedback signal indicating an external pressure applied to the at least one cushion. The actuator means may be driven in response to this feedback signal.

In an embodiment, the at least one cushion may be arranged on a side of the base structure and/or the RF coil facing away from a patient contacting side.

The cushion may be positioned so as to push onto the RF coil and/or the base structure so as to cause a displacement of the base structure and/or the RF coil relative to the subject and/or a MRI system. The cushion may be arranged so as to fill a space between the MRI coil arrangement and an inner side of a bore of a MRI system. The one or more cushions may be disposable and may be releasable fixed to the MRI coil arrangement.

According to an embodiment, the position detecting means may be operable in a sampling rate allowing detection of an organ displacement of the subject and, in accordance, controlling of the actuator means.

This may provide a relatively quick deformation or variation of the shape of the base structure. Furthest, it may allow compensation for respiratory/breathing, cardiac movements etc. of the subject. Additionally, bulk motion of the subject or parts of the subject, e.g. its arms or legs may be detected and/or compensated.

According to an embodiment, the position detecting means may comprise one or more distance sensors adapted or configured to provide information about a distance between a surface of the subject and the coil.

The distance sensors may be distributed, in particular evenly distributed, so as to allow detection of even small movements or displacements.

Additionally or alternatively, the position detecting means may be operable by air and be configured to detect an externally applied pressure indicating a contact with the subject.

In an embodiment, the control means may further be coupled to a deformation determining means adapted to provide information about the current deformation of the base structure.

By way of example, the determining means may be arranged on or at least partly in the base structure. In an example, the determining means may comprise a strain sensor provided on an optical fiber, or optical fibers with Bragg gratings that are configured to provide real-time feedback related to its own dynamic shape, which corresponds to, or is related to, a shape of the base structure and/or the RF coils, or the like. In this manner, shapes and/or positions of the steerable elongate instrument can be dynamically determined using optical fibers that include Bragg gratings. Operation of the determining means may comprise receiving a reflected signal from the strain sensor, determining a spectral profile of the reflected signal, and determining deformation of the optical fiber based on a comparison of the spectral profile of the reflected signal with a predetermined spectral profile.

According to an embodiment, the base structure further may comprise a pressure detection means adapted or configured to capture a pressure exerted by the subject on the base structure, wherein the control means may further be adapted or configured to drive the actuator means for compensating the captured pressure.

This may allow a feedback on the movement of the subject. Further, it may allow to synchronize the distance of the RF coil relative to respiratory/breathing, cardiac movements etc. of the subject for constant image quality.

In an embodiment, the control means may further be coupled to a magnetic resonance imaging system and adapted to provide an image capture signal causing the imaging system to perform imaging only when a position of the RF coil relative to the subject is compensated.

The compensation may be for a movement and/or displacement between the subject and the RF coil. This may further improve image quality.

According to an embodiment, the base structure may comprise a foil on which the coil is printed.

This may allow a deformation of the RF coil common to the deformation of the base structure. Further, the coil arrangement may be provided with a small, especially thin, size.

In an embodiment, the base structure may comprise a first foil and a second foil which form a sandwich arrangement with the RF coil arranged in between, wherein the foil may comprise on a side of the coil facing the subject at least one aperture fluidically opening to a pressure source.

This may provide a flexible double sided foil system having the RF coil integrated. At the subject facing side the apertures, such as a mesh, foam, membrane etc., may be provided. When providing a negative pressure, in particular vacuum like, the foil system may stick to the subject. The pressure may be applied via channels, conduits or the like, integrated in the foil system. A suitable distribution of intake fittings, intake sockets may allow a good connection of the foil and the subject at all borders and in a homogenous way, especially at the position of the RF coil to get a defined distance from coil to the subject. Also, a biocompatible liquid, such as a gel, glue or the like, may provide a proper or defined adhesion of the foil based sensor coil system to the subject.

According to an aspect, a magnetic resonance imaging (MRI) system is provided. The MRI system may also be referred to as an MRI scanner, a linear accelerator (linac) or the like, and may comprise a bore, a couch for supporting a subject to be examined, which is selectively movable into the bore, and a RF coil arrangement. The coil arrangement comprises a base structure having a variable shape, at least one RF coil arranged on or in the base structure, an actuator means extending along the base structure such that the base structure is deformable along and/or about at least one axis to form a receiving space for a subject, a position detecting means adapted to detect a change in position of at least a portion of the subject to be examined relative to the RF coil, and a control means coupled to the position detecting means and the actuator means, wherein the control means is adapted to drive the actuator in response to a detected change of the current position relative to a previous position.

In an embodiment, the magnetic resonance imaging system may comprise at least one cushion having a variable shape and being arranged at an inner wall of the bore and adapted to press the coil arrangement towards the subject.

The cushion may also be referred to as an external cushion, in particular with respect to the coil arrangement, and be arranged on a side of the RF coil and/or the base structure facing away from the subject and/or the couch. The cushion may be fluidically operable and be connected to the actuator means. It may be adapted or configured to at least partially compensate for detected movements and/or any displacements of the subject. It may be arranged so as to allow the coil arrangement to be pushed towards the subject and/or the couch. The one or more cushions may be disposable and may be releasable fixed to the MRI system. Further, the one or more cushions may be arranged in a non-magnetic sleeve.

According to an embodiment, two or more bags or cushions may be provided, wherein the two or more bags have a comparatively smaller individual volume, in particular in comparison with a single bag or cushion. The actuator means may then be operatively connected to each of the two or more bags or cushions to individually inflate and/or deflate the respective bags or cushions.

Thus, using these several small cushions or bags, the pressure on the subject and/or the RF coil can be adjusted more precisely.

In an embodiment, the actuator means may be connected to at least one fluidically operable cushion embedded in the couch.

The one or more cushions may be referred to as external cushion or external cushions. It may be releasable fixed to a retaining structure, for example, a recess, fixation clamps or the like. The one or more cushions may be disposable. The cushion may be adapted or configured to allow a feedback signal caused by measuring a pressure inside the cushion indicating a motion, movement and/or displacement of the subject when the measured pressure changes, e.g. decreases or increases.

In an embodiment, the base structure may be arranged within a cover adapted to covering the subject and to be fluidically inflated or deflated by a pressure source.

The pressure source may be referred to as the actuator means. The cover may be non-magnetic.

According to an embodiment, the cover comprises a double wall structure and the pressure source is fluidically connected to a space enclosed between the two walls.

By providing, for example, a negative pressure, such as a vacuum, into a space between the two walls, a shape of the bag-like cover is fixed, and the negative pressure between the cover and the subject may be released.

According to an aspect, a method for positioning an RF coil for a magnetic resonance imaging system relative to a subject to be examined is provided. The method comprises:
  detecting a current position of at least a portion of the subject relative to the RF coil, and
  driving an actuator means extending along a base structure, in or on which the RF coil is arranged, such that the base structure is deformable along and/or about at least one axis, in response to a detected change in position of the subject relative to the coil between the detected current position and a previous position.

The method may allow at least partly compensating for a detected motion and/or displacement of the subject. It may also allow synchronizing a shape of the RF coil to any motion cause by breathing, cardiac or bulk motion of the subject to provide a good and/or constant image quality.

According to an aspect, a non-transitory computer-readable medium is provided. The computer-readable medium has stored thereon sequences of instructions, the sequences of instructions including instructions which, when executed by a computer system, cause the computer to perform the above method.

The computer-readable medium may, in particular, be processed by the above MRI system and/or the above MRI coil arrangement.

These and other aspects of the present invention will become apparent from and be elucidated with reference to the embodiments described hereinafter.

BRIEF DESCRIPTION OF THE DRAWINGS

Exemplary embodiments of the invention will be described in the following with reference to the accompanying drawings.

DETAILED DESCRIPTION OF EMBODIMENTS

Figure 1:
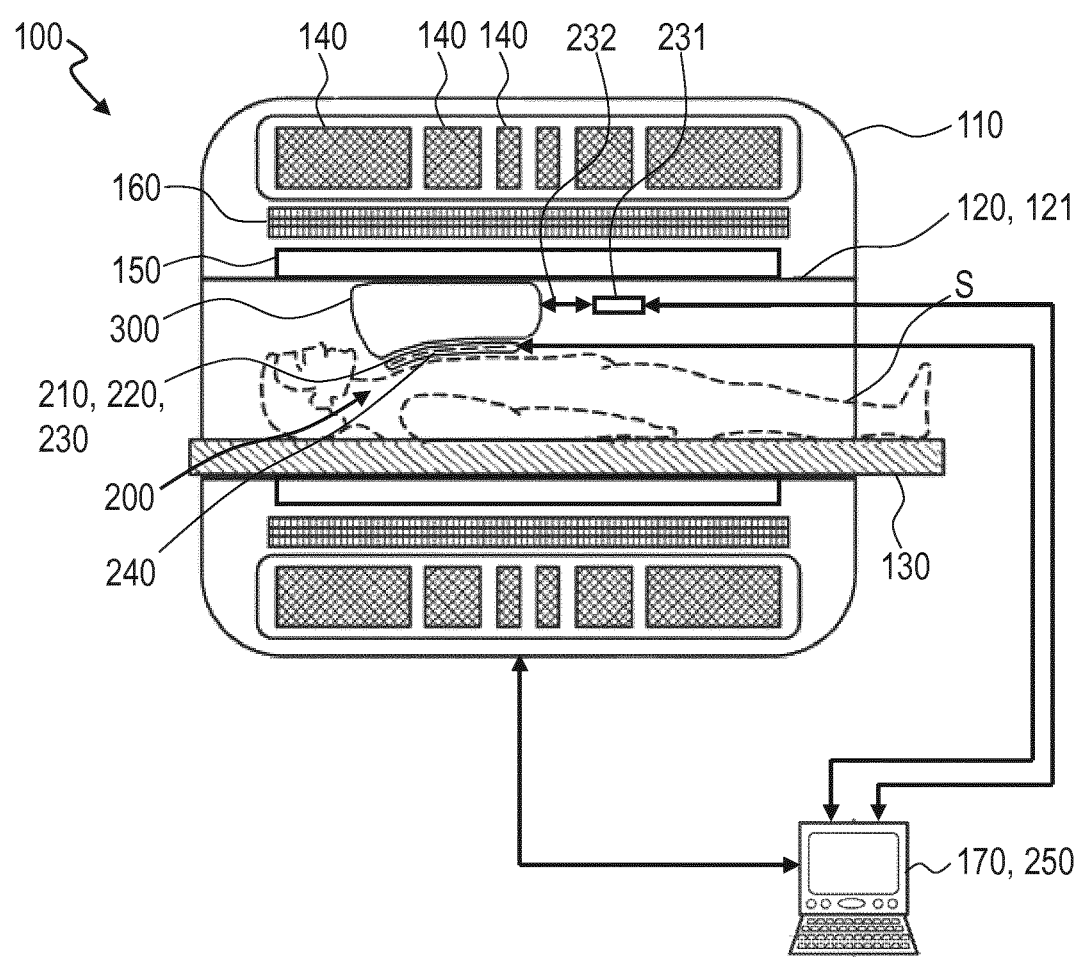
FIG. 1 shows an embodiment of a schematically illustrated MRI system with a bore, a coil arrangement, and a cushion.

FIG. 1 shows in a schematic cross-section an embodiment of a magnetic resonance imaging (MRI) system 100. It comprises a housing 110 having a bore 120 that defines an examination region for a subject S to be examined. By way of example, the bore 120 is cylindrically shaped, wherein other geometries such as an open MR geometry may also be used. The subject S, which may also referred to as a patient to be imaged, is placed on a couch 130 which is selectively movable into the bore 120. The system MRI 100 comprises a main magnet 140 that is configured to generate a static main (B0) magnetic field in the examination region inside the bore 120. The excited magnetic resonance, which in particular may excited by a system integrated RF body coil 150, such as a birdcage, TEM or array coil built up by loops, dipoles, stripe lines or combinations thereof, may be spatially encoded, phase- and/or frequency-shifted, or otherwise manipulated by magnetic field gradients selectively generated by a set of magnetic field gradient coils 160. The MRI system 100 is controlled and/or operated by a control means 170 which, for sake of simplicity, is shown here as a computer system. It may comprise several subsystems unspecified here, such as a processor, a reconstructing processor, a data memory for storing computer program elements and/or images of the subject S, a magnetic resonance data acquisition controller etc., and may be configured to generate, spatially encode, and read out magnetic resonance data, to reconstruct by a magnetic resonance reconstruction processor to generate one or more images of the subject S.

For detecting magnetic resonance that can be selectively excited, one or more radio-frequency (RF) coil arrangements 200 are arranged in the examination region. In this exemplarily illustration, one RF coil arrangement 200 is provided as a local coil, which is formed as a local chest coil so as to face a front side of the lying subject S. It should be noted that the RF coil arrangement 200 may be another type of coil configured to be located at other regions of the subject S, such as a head coil or the like. Generally, the coil arrangement 200 may be provided as a birdcage coil, a transverse electromagnetic (TEM) resonator coil, a loop array, a stripe line array, a dipole etc. It should be noted the RF coil arrangement 200 may be configured as receiving only, or a transmitting/receiving, transceiver, coil.

The coil arrangement 200 comprises a base structure 210 having a variable shape, so as to be deformable. The base structure 210 is made from any suitable material that provides a variable shape and that is MR-compatible. On or, as exemplarily illustrated in FIG. 1, embedded into the base structure 210, one or more RF coils 220 are arranged, which may also be referred to as an antenna and may be provided as an array. It should be noted that the RF coils 220 are illustrated schematically and may comprise one or more actual coil/antenna conductors including analog/digital preamplifier, detune electronics etc. The RF coils 220 may be adapted or configured to deform at least substantially with the shape change of the base structure 210. At least partially along the base structure 210, an actuator means 230 (see e.g. FIGS. 3 and 4) extends such that the base structure 210 is deformable along and/or about at least one axis, which will be described in more detail below. The coil arrangement 200 further comprises a position detecting means 240 (see e.g. FIG. 3 for more details) which is adapted to detect a current position of at least a portion of the subject S relative to the RF coil 220 and/or the base structure 210. The position detecting means 240 may be provided as a distance sensor or the like, and will be described in more detail below. Coupled to the actuator means 230 and the position detecting means 240 is a control means 250, which in this embodiment is exemplarily integrated in the control means 170 of the MRI system 100. The coil arrangement 200 is coupled to the control means 170 and/or 250 via a suitable data connection. In particular, the control means 170, 250 is coupled to the actuator means 230 so as to drive the actuator means 230 in response of motion and/or movement of the subject S detected by the position detecting means 240. Thereby, an at least partial compensation for the detected movement of the subject S may be achieved. As indicated in FIG. 1, the shape of the coil arrangement 200 may be adapted in real-time to the shape of the body surface of the subject S, wherein in the exemplary arrangement in the region of the chest, for example, any lifting and lowering of the chest can be understood as movement. In this regard, any other displacement of extremities or organs may be regarded as movement. For compensating such movements the position detecting means 240 is operable in a sampling rate allowing detection of an organ displacement of the subject S and in accordance controlling of the actuator means 230.

The control means 170 is further adapted or configured to provide an image capture signal causing the imaging system to perform imaging only when the position, movement, displacement of the subject S is compensated.

Further with reference to FIG. 1, a cushion-like pressure element 300, in the following referred to as a bag or cushion, which can be structurally assigned to either the MRI system 100 or the coil arrangement 200, is arranged in the bore 120. The actuator means 230 comprises a pressure source 231, such as a compressor or the like, to inflate and/or deflate, e.g. by providing one or more outlet valves, the cushion 300, via one or more conduits 232, in response to the detected movement. By deforming the cushion 300, by e.g. inflating and/or deflating of one or more of its air tight sections, the bag or cushion 300 may urge the base structure 210 and/or the RF coils 220 in a shape so as to adapt to the changing body surface of the subject S. In at least some embodiments, there may be provided two or more bags or cushions 300 having a comparatively smaller individual volume, in particular in comparison with a single bag or cushion 300. The actuator means 230 may then be operatively connected to each of the two or more bags or cushions 300 to individually inflate and/or deflate the respective bags or cushions 300. In at least some embodiments, the RF coil 220 may be integrated in the one or more bags or cushions 300. In another embodiment, the one or more bags may be integrated in the RF coil. The one or more bags or cushions 300 is arranged on an inner wall 121 of the bore 120 and is detachably fastened there. Thereby, the one or more bags or cushions 300 may use the inner wall 121 as an abutment. Although not shown in FIG. 1, it may also be arranged in a recess or the like of the inner wall 121.

Figure 2:
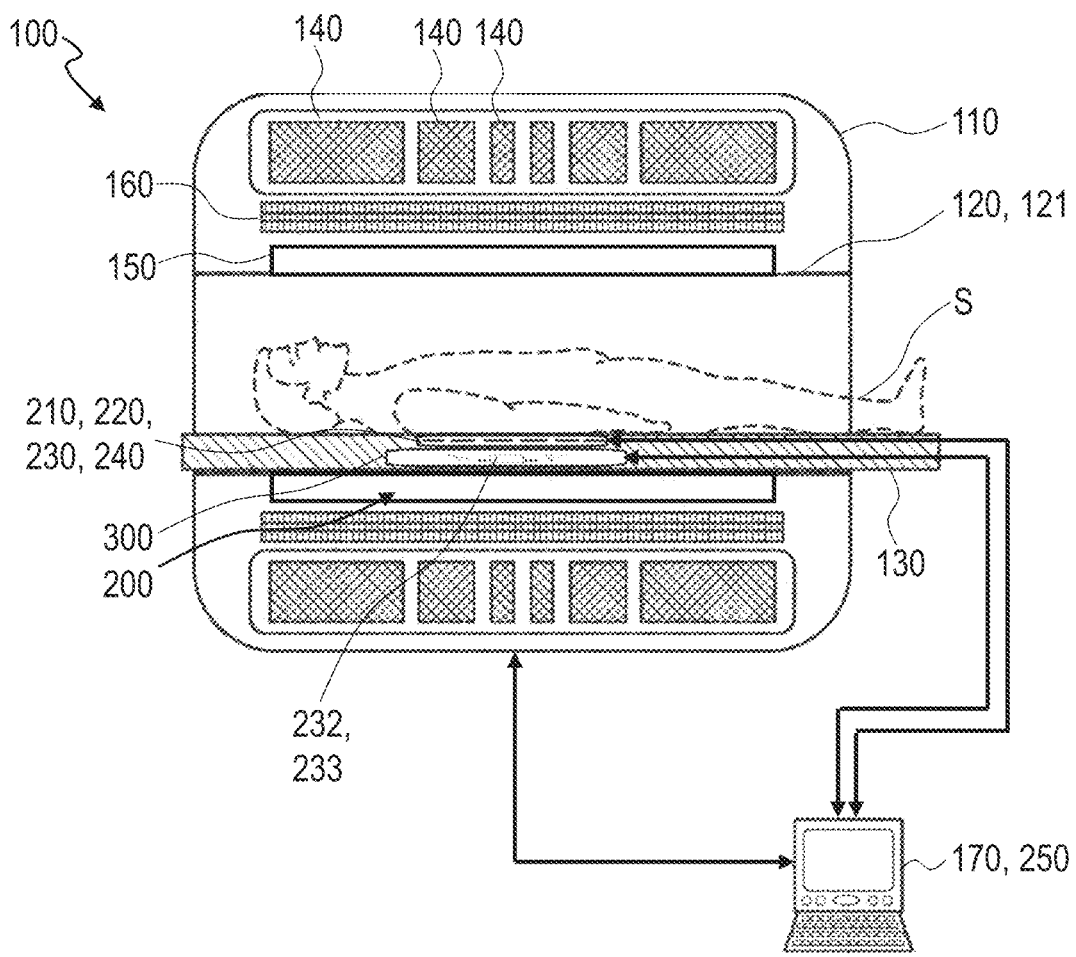
FIG. 2 shows another embodiment of a schematically illustrated MRI system with a bore, a coil arrangement, and a cushion.

FIG. 2 shows in a schematic cross-section a further embodiment of the MRI system 100. It differs from the above in that the cushion 300 is alternatively or additionally arranged in the couch 130 and that, by way of example, the actuator means 230 comprises a mechanical driving system having one or more strand-shaped elements 233 (see FIG. 5 for more details), such as a Bowden cable or the like, embedded in several portions of the cushion 300. By driving the strand-shaped elements 233, the cushion 300 changes its shape, in particular its outer geometrical form to adapt to the body surface of the subject S. The cushion 300 is embedded in the couch 130, which may for this purpose have a recess and suitable fastening means for a releasable attachment.

Figure 3:
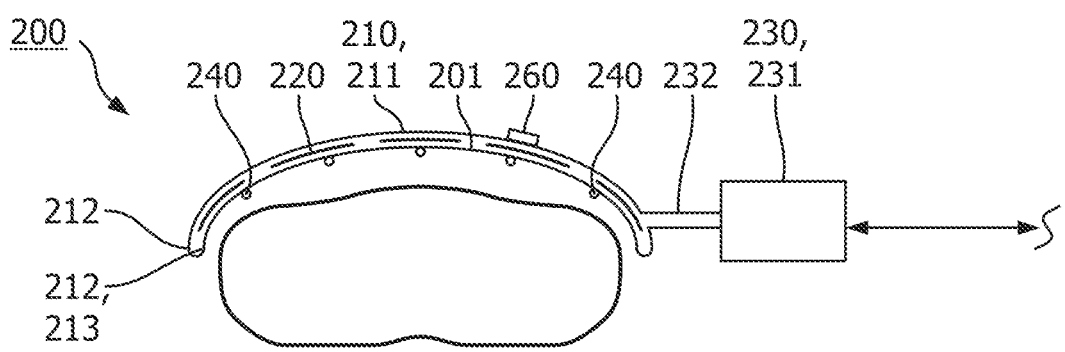
FIG. 3 shows an embodiment of a schematically illustrated coil arrangement.

FIG. 3 schematically illustrates the coil arrangement 200 in more detail. It comprises the base structure 210 carrying the RF coils 220 and having a plurality of separated, fluidically tight sections 211 (see FIG. 4 for more details)

extending along the base structure 210. The sections 211 are connected to pressure source 231 via conduits 232. The pressure source 231 is controllable connected to the control means 170, 250, as indicated by an unspecified data connection line, and may be inflated and/or deflated in sections. On a side of the base structure 210 and/or the RF coils 220 facing the subject S, the above-mentioned position detection means 240 are arranged so as to the detect, e.g. by real-time measuring the distance to the subject S, a movement and/or displacement of the subject S relative to the coil arrangement 200. In response to any detected movement and/or displacement the control means 170, 250 may drive the actuator means 230, in particular the pressure source 231, so as to adapt the shape of the base structure 210 and/or the RF coils 220 to the body surface of the subject S, as schematically indicated in FIG. 3.

Further referring to FIG. 3, in some embodiments, the base structure 210 comprises a foil 212 on which the RF coil 220 is printed. By way of example, the base structure 210 shown in FIG. 4 comprises a first foil 212 and a second foil 212 which form a sandwich arrangement with the RF coil 220 arranged in between. Although not illustrated in detail, the foil 212 comprises on a side of the coil facing the subject S at least one aperture 213, such as a mesh or the like, which is connected to the pressure source 231 via, in particular, the sections 211.

Figure 4:
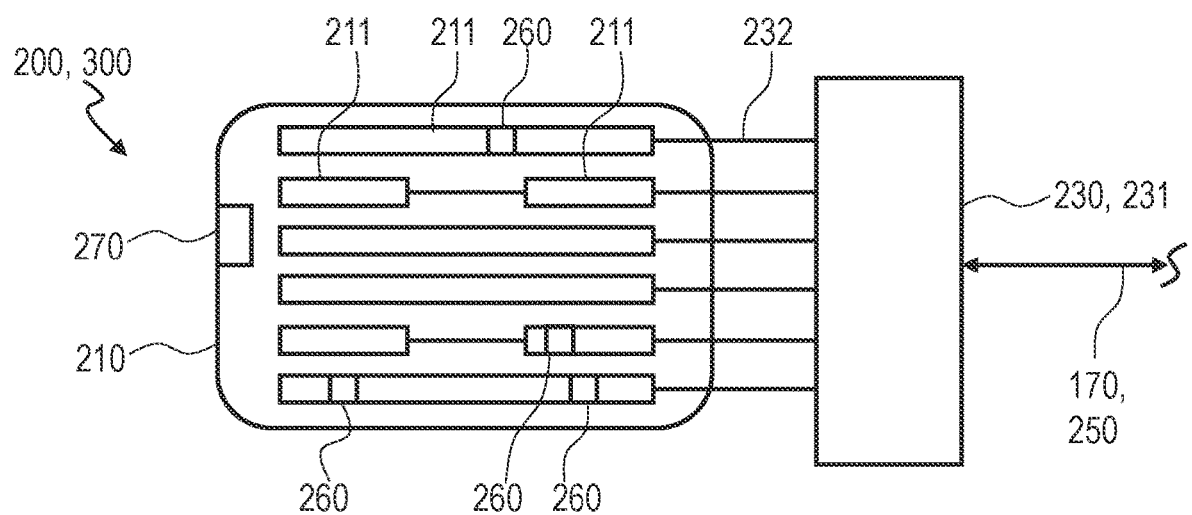
FIG. 4 shows an embodiment of a schematically illustrated actuator means.

FIG. 4 shows a schematic plan view of an embodiment of the coil arrangement 200 and/or the cushion 300, some structural parts of which are at least similar to that of the coil arrangement 200. The sections 211 are spaced-apart from each other and are selectively drivable by the actuator means 230, which, by way of example, comprise the pressure source 231 fluidically connected to the sections 211 via the conduits 232. As indicated by the unspecified data connection line, the control means 170, 250 may control the pressure source 231 so as to deform along and/or about one or more axes. For detecting the current deformation of the base structure 210 and/or the cushion 300, the control means 170, 250 is connected to one or more deformation determining means 260, which extend along the base structure 210 and/or the cushion 300 so as to provide a real-time feedback signal containing information about the current shape of the base structure 210 and/or the cushion 300 to the control means 170, 250. The deformation determining means 260 may be provided, by way of example, as a system for sensing and determining the dynamic shape, positions, temperatures, and stress or strain along portions, sections, or the length of the base structure 210 and/or the cushion 300 using optical fibers with Bragg gratings, or the like. The more deformation determining means 260 are distributed over the base structure 210, the more accurate the measurement can be performed.

Further referring to FIG. 4, in some embodiments, the base structure 210 and/or the cushion 300 further comprises one or more pressure detection means 270 which is adapted or configured to capture a pressure exerted by the subject on the base structure 210 and/or the cushion 300. Accordingly, the control means 170, 250 is further adapted to drive the actuator means 230 for compensating the captured pressure which may be an indicator for a too small distance to the subject S. The more pressure detection means 270 are distributed over the base structure 210, the more accurate the measurement can be performed.

Figure 5:
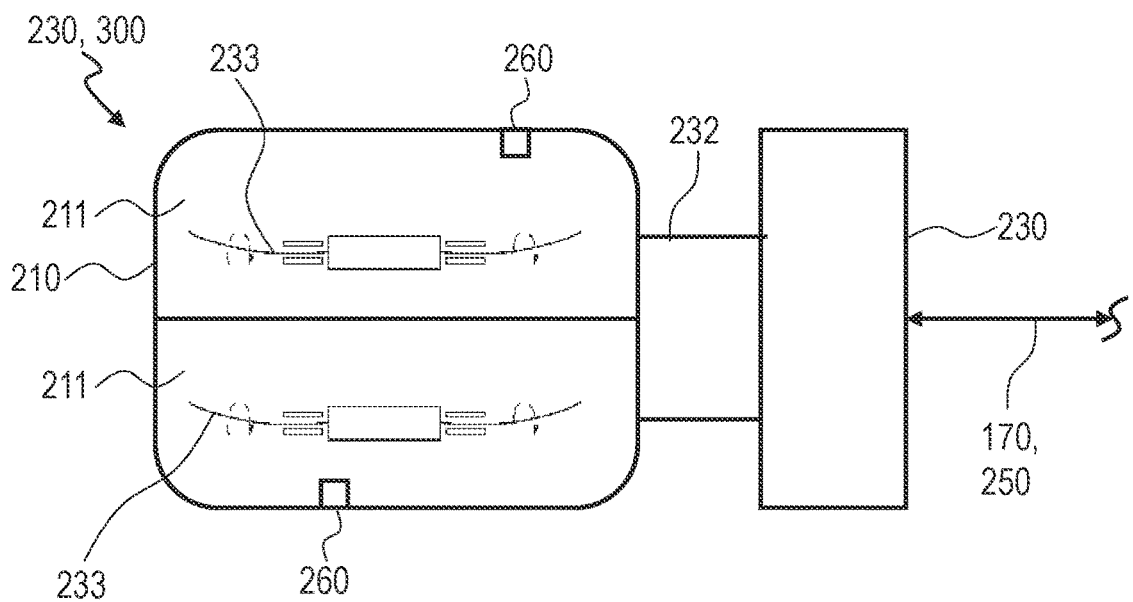
FIG. 5 shows an embodiment of a schematically illustrated actuator means.

FIG. 5 shows an embodiment of the arrangement 200 and/or the cushion 300, according to which the actuator means 230 comprises the above-mentioned strand-shaped elements 233 extending along the base structure 210 and/or the cushion 300. The strand-shaped elements 233 are embedded in separated sections 211 spaced-apart from each other and are connected to the actuator means 230 via the conduits 232, which in this context may be referred to as guidance. In particular for power transmission between the strand-shaped elements 233 and the base structure 210, e.g. a hinge couples the strand-shaped elements 233 to the base structure so as to be in engagement. Again, the deformation determining means 260 may provide real-time feedback about the current shape caused by manipulating the strand-shaped elements 233. As indicated in FIG. 5, the control means 170, 250 is connected to the actuator means 230.

Figure 6:
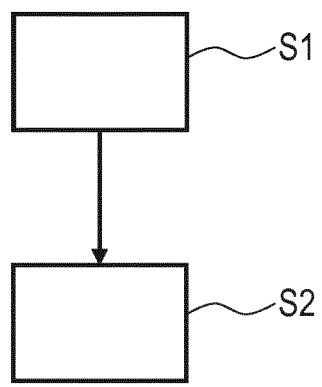
FIG. 6 shows a flow chart of a method of positioning an RF coil relative to a subject to be examined.

FIG. 6 shows a flow chart of a method for positioning the RF coil 220 to the subject S and/or for operating the MRI system 100. The method may be carried out by using the above MRI system 100, the coil arrangement 200 and/or the cushion 300. In a step S1, the current position of at least a portion of the subject S relative to the RF coil 220 is detected, in particular by using the position detection means 240. In one or more optional steps, also the current shape of the coil arrangement 200, in particular the base structure 210 and/or the RF coil 220 may be detected so as to adapt the shape in real-time to the detected surface shape of the subject S (as illustrated in FIGS. 1, 2 and 3). Likewise, in one or more optional steps, fiducial markers (not shown) may be captured by a camera or the like, a surface temperature of the subject S may be detected by the deformation determining means 260 or other suitable temperature sensors. In a step S2, the actuator means 230, and optionally its above-mentioned components, which extends along the base structure 210 is driven such that the base structure 210 is deformed in response to the possibly detected change in position of the subject S relative to the RF coil 220 between the detected current position and a previous position. Thereby, at least a partial compensation for this change in position may be achieved. In some embodiments, deformation of the base structure 210 and/or the RF coil 220 is performed in real-time to synchronize to any movement of the subject, such as to breathing or the like. In one or more optional steps, real-time SAR calculation is performed considering the detected current position, the shape of the coil arrangement 200 etc. Further, in one or more optional steps, a real-time system matrix of the coil arrangement 200 may be determined. Also, in one or more optional steps, the control means 170, 250 is adapted to provide an image capture signal causing the MRI system to perform imaging only when the position is compensated.

It has to be noted that embodiments of the invention are described with reference to different subject matters. In particular, some embodiments are described with reference to coil arrangement claims whereas other embodiments are described with reference to MRI system claims. However, a person skilled in the art will gather from the above and the following description that, unless otherwise notified, in addition to any combination of features belonging to one type of subject matter, also any combination between features relating to different subject matters is considered to be disclosed with this application. However, all features can be combined providing synergetic effects that are more than the simple summation of the features.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

In the claims, the word "comprising" does not exclude other elements or steps, and the indefinite article "a" or "an" does not exclude a plurality. A single processor or other unit may fulfill the functions of several items re-cited in the claims. The mere fact that certain measures are re-cited in mutually different dependent claims does not indicate that a combination of these measures cannot be used to advantage. Any reference signs in the claims should not be construed as limiting the scope.

LIST OF REFERENCE SIGNS 100 magnetic resonance imaging (MRI) system
110 housing
120 bore
121 inner wall
130 couch
140 main magnet
150 body coil
160 magnetic field gradient coil
170 control means
200 coil arrangement
210 base structure
211 base structure section
212 base structure foil
213 aperture
220 RF coil
230 actuator means
231 pressure source
232 conduit
233 strand-shaped element
240 position detecting means
250 control means
260 deformation determining means
270 pressure detection means
300 pressure element (e.g. cushion)

The invention claimed is:

1. An arrangement for magnetic resonance imaging, the arrangement comprising:
a base structure having a variable shape,
a radio frequency (RF) coil arranged on or in the base structure,
an actuator coupled to the base structure such that the base structure is deformable along and/or about at least one axis in response to driving the actuator,
a position detecting sensor adapted to detect a current position of at least a portion of a subject to be examined relative to the RF coil, and
a controller coupled to the position detecting sensor and the actuator,
wherein the controller is adapted to adjust the variable shape of the base structure to maintain a contact of an outer surface of the base structure and/or the RF coil with at least the portion of the subject by driving the actuator in response to a detected change of the current position of the portion of the subject to be examined relative to the RF coil, compared with a previous position of the portion of the subject to be examined relative to the RF coil,
wherein the position detecting sensor is adapted to operate in a sampling rate to detect an organ displacement of the subject, wherein detection of the organ displacement controls the actuator.

2. The arrangement of claim 1,
wherein the actuator is arranged on a side of the coil facing away from the subject.

3. The arrangement of claim 1,
wherein the actuator comprises one or more conduits coupled to and adapted to be controlled by the controller.

4. The arrangement of claim 3,
wherein at least two conduits open into spaced-apart sections of the base structure and are selectively controllable.

5. The arrangement of claim 3,
wherein in the conduit a strand-shaped element is guided, which is in engagement with the base structure.

6. The arrangement of claim 1,
wherein the position detecting sensor comprises one or more distance sensors adapted to provide information about a distance between a surface of the subject and the coil.

7. The arrangement of claim 1,
wherein the controller is further coupled to a deformation determining sensor adapted to provide information about the current deformation of at least the base structure.

8. The arrangement of claim 1,
wherein the base structure further comprises a pressure detection sensor, wherein the pressure detection sensor is adapted to detect a pressure exerted by the subject on the base structure,
wherein the controller is further adapted to drive the actuator for compensating for the detected pressure.

9. The arrangement of claim 1,
wherein the controller is further coupled to a magnetic resonance imaging system and adapted to provide an image capture signal causing the magnetic resonance imaging system to perform imaging only when the detected change of the current position of the portion of the subject relative to the previous position of the portion of the subject is compensated for by driving the actuator.

10. The arrangement of claim 9,
wherein the base structure comprises a first foil and a second foil which form a sandwich arrangement with the coil arranged in between,
wherein the second foil comprises on a side of the coil facing the subject at least one aperture fluidically opening to a pressure source.

11. The arrangement of claim 1, further comprising a cushion having a variable shape, wherein the cushion extends at least partially along the base structure, wherein the cushion is adapted to be deformable in response to driving the actuator, wherein deformation of the variable shape of the cushion in response to driving the actuator deforms the variable shape of the base structure.

12. The arrangement of claim 11, wherein the actuator comprises at least one conduit coupled to and adapted to be controlled by the controller, and wherein the at least one conduit is connected at one end to a pressure source and fluidically opens at another end to then cushion.

13. The arrangement of claim 11, wherein the cushion is arranged on a side of the base structure facing away from a subject contacting side of the base structure.

14. A magnetic resonance imaging system, comprising:
a bore,
a couch for supporting a subject to be examined, selectively movable into the bore, and
the arrangement of claim 1.

15. The arrangement of claim 14, further comprising a cushion having a variable shape, wherein the cushion extends at least partially along the base structure, wherein the cushion is adapted to be deformable in response to driving the actuator, wherein deformation of the variable shape of the cushion in response to driving the actuator deforms the variable shape of the base structure.

16. The arrangement of claim 15, wherein the cushion is embedded in the couch, and wherein the base structure is arranged between the cushion and the portion of the subject.

17. A method for positioning a radio frequency (RF) coil for a magnetic resonance imaging system relative to a subject to be examined, the method comprising:
- a position detecting sensor detecting a current position of at least a portion of the subject relative to the RF coil, wherein the RF coil is arranged on or in a base structure having a variable shape, wherein the position detecting sensor operates in a sampling rate to detect an organ displacement of the subject,
- determining a change of the current position of the portion of the subject relative to the RF coil, compared with a previous position of the portion of the subject relative to the RF coil, and
- adjusting the variable shape of the base structure to maintain a contact of an outer surface of the base structure and/or the RF coil with at least the portion of the subject by driving an actuator coupled to the base structure such that the base structure is deformable along and/or about at least one axis, in response to a detected change of the current position of the portion of the subject relative to the RF coil, compared with the previous position of the portion of the subject relative to the RF coil,
- wherein detection of the organ displacement controls the actuator.

18. The method of claim 17, wherein adjusting the shape of the base structure comprises deforming a variable shape of a cushion which extends at least partially along the base structure, wherein the cushion is adapted to be deformable in response to driving the actuator, wherein deformation of the variable shape of the cushion in response to driving the actuator deforms the variable shape of the base structure.

19. A non-transitory computer-readable medium having stored thereon sequences of instructions, the sequences of instructions including instructions which, when executed by a computer system, cause the computer to perform the method according to claim 17.

* * * * *